(12) United States Patent
Liao et al.

(10) Patent No.: US 11,784,425 B1
(45) Date of Patent: Oct. 10, 2023

(54) CHIP-TO-MODULE CABLE ASSEMBLY AND PCB CIRCUIT

(71) Applicant: Ruijie Networks Co., Ltd., Fujian (CN)

(72) Inventors: Zaiyi Liao, Fujian (CN); Hui Fan, Fujian (CN); Peihang Yang, Fujian (CN)

(73) Assignee: Ruijie Networks Co., Ltd., Fujian (CN)

( * ) Notice: Subject to any disclaimer, the term of this patent is extended or adjusted under 35 U.S.C. 154(b) by 0 days.

(21) Appl. No.: 18/182,078

(22) Filed: Mar. 10, 2023

Related U.S. Application Data (63) Continuation of application No. PCT/CN2022/124967, filed on Oct. 12, 2022.

(51) Int. Cl.
   *H01R 12/59* (2011.01)

(52) U.S. Cl.
   CPC .................. *H01R 12/592* (2013.01)

(58) Field of Classification Search
   None
   See application file for complete search history.

(56) References Cited

U.S. PATENT DOCUMENTS

| | | | | |
|---|---|---|---|---|
| 9,368,892 | B2 * | 6/2016 | Kondo | H01R 12/775 |
| 10,756,468 | B2 * | 8/2020 | Liao | H01R 13/6473 |
| 10,938,157 | B2 * | 3/2021 | Yang | H01R 43/26 |

FOREIGN PATENT DOCUMENTS

| | | |
|---|---|---|
| CN | 101027950 A | 8/2007 |
| CN | 101031185 A | 9/2007 |
| CN | 103745703 A | 4/2014 |
| CN | 106299771 A | 1/2017 |
| CN | 213660826 U | 7/2021 |
| CN | 115003020 A | 9/2022 |
| JP | 2003101165 A | 4/2003 |
| JP | 2007053197 A | 3/2007 |
| JP | 2009043833 A | 2/2009 |

\* cited by examiner

*Primary Examiner* — Ross N Gushi
(74) *Attorney, Agent, or Firm* — ArentFox Schiff LLP; Michael Fainberg (57) ABSTRACT

This application relates to a chip-to-module cable assembly, includes a first joint, a second joint and a first flexible PCB cable, the flexible PCB cable, including flexible material parts located on upper and lower layers and a connection portion located on a middle layer, wherein the connection portion comprises two rigid material portions respectively located at end portions of the flexible material parts on the upper and lower layers and a hollow portion between the two rigid material portions, the flexible material parts each comprises at least one conducting wire, one end of each of the at least one conducting wire is connected to a first interface terminal of the first joint, and another end of the conducting wire is connected to a second interface terminal of a second joint.

20 Claims, 5 Drawing Sheets

CHIP-TO-MODULE CABLE ASSEMBLY AND PCB CIRCUIT

CROSS REFERENCE

This application is a continuation of International Patent Application No. PCT/CN2022/124967, filed on Oct. 12, 2022, which is hereby incorporated by reference in its entirety.

TECHNICAL FIELD

This application relates to the communication field, and in particular, to a chip-to-module cable assembly and a PCB circuit.

BACKGROUND

A chip-to-module (Chip-to-module, C2M) physical channel is the most important physical layer interconnection of a communication device. The topology of the C2M physical channel mainly includes a connection between a main chip and an I/O (Input/Output, input/output) connector (I/O Connector). To satisfy a data communication requirement, the C2M physical channel needs to satisfy a channel loss requirement.

One way to implement the C2M physical channel is to connect a switching chip such as a MAC (Medium Access Control, medium access control) chip to the I/O connector through copper foil inside a multilayer printed circuit board (Printed Circuit Board, PCB). Lengths of wires between the switching chip and the I/O connector, material properties, and process technologies determine a loss of an interconnection channel (C2M physical channel). At a low speed lower than a specified speed threshold, a conventional PCB solution can satisfy most applications of C2M physical channel.

With the development of application requirements of big data, cloud computing, AI (Artificial Intelligence, artificial intelligence), and the like, when a C2M speed is increased to a high speed higher than the specified speed threshold, the conventional PCB solution cannot satisfy the requirement of signal transmission.

A cable may be directly connected between the switching chip and the I/O connector, and is gradually applied to the C2M physical interconnection within a device due to a low loss of the cable. However, due to the large size of the cable, it occupies more space than the inner interconnection of PCB multilayer boards. Therefore, the cable is not applicable to a scenario in which high density and a large quantity of interconnections exist.

SUMMARY

To resolve the problem that a conventional PCB solution cannot satisfy a high-speed data transmission requirement and the problem that a high-speed cable occupies large space and is difficult to assemble, embodiments of this application provide a chip-to-module cable assembly and a PCB circuit that can satisfy a high-speed data transmission requirement, save space, and be flexible to assemble.

According to a first aspect, an embodiment of this application provides a chip-to-module cable assembly, including:

a first joint, including a plurality of first interface terminals, one end of each first interface terminal is connected to a signal port of an I/O connector, and an other end of the first interface terminal is connected to a conducting wire in a flexible PCB cable;

the flexible PCB cable, including two flexible material parts located on upper and lower layers and a connection portion located on a middle layer, where the connection portion includes two rigid material portions respectively located at end portions of the two flexible material parts respectively located on the upper and lower layers and a hollow portion between the two rigid material portions, the flexible material parts each includes at least one conducting wire, one end of each of the at least one conducting wire is connected to a first interface terminal of the first joint, and an other end of the conducting wire is connected to a second interface terminal of a second joint; and the second joint, including a plurality of second interface terminals, where one end of each second interface terminal is connected to a conducting wire in the flexible PCB cable, and an other end of the second interface terminal is connected to a signal port on a main control board.

In one or more possible embodiments, the two rigid material portions are respectively located at end portions of the two flexible material parts on the upper and lower layers, and are respectively bonded to the end portions of the two flexible material parts on the upper and lower layers.

In one or more possible embodiments, at least one conducting wire in the flexible material part on the upper layer is connected to a corresponding first interface terminal at an end portion of the flexible material part on the upper layer through an upward hole, at least one conducting wire in the flexible material upper layer on the lower layer is connected to a corresponding first interface terminal at an end portion of the flexible material part on the lower layer through a downward hole.

In one or more possible embodiments, at least one conducting wire in the flexible material part on the upper layer is connected to a corresponding second interface terminal at an other end portion of the flexible material part on the upper layer through an upward hole, at least one conducting wire in the flexible material part on the lower layer is connected to a corresponding second interface terminal at an other end portion of the flexible material part on the lower layer through a downward hole.

In one or more possible embodiments, there is at least one flexible PCB cable, and each of the at least one flexible PCB cable is separately connected to a first joint and a second joint.

In one or more possible embodiments, the first joint is a golden finger connector, and the golden finger connector includes two first golden fingers, two pads, and an external connection cable; the two first golden fingers are respectively located on sides, perpendicular to the holes, of the two flexible material parts on the upper and lower layers; and one end of each first interface terminal of each first golden finger is connected to a conducting wire in a hole, and an other end of the first interface terminal is fastened by using the pad and is connected to a signal port of the I/O connector through the external connection cable.

In one or more possible embodiments, the second joint includes two second golden fingers, the two second golden fingers are respectively located on sides, perpendicular to the holes, of the two flexible material parts on the upper and lower layers, one end of each second interface terminal of each second golden finger is connected to a conducting wire in a hole, and an other end of the second interface terminal is inserted into a golden finger slot on the main control board so as to connect to a signal port on the main control board.

In one or more possible embodiments, the second joint is a socket elastic piece, one end of each second interface terminal in the socket elastic piece is connected to a conducting wire in a hole, and an other end of the second interface terminal is inserted into a signal port on the main control board.

In one or more possible embodiments, there are a plurality of flexible PCB cables, and the cable assembly further includes:
   an intermediate rigid support part, located between and bonded to end portions, connected to the second joint, of the neighboring flexible PCB cables; and
   an end rigid support part, located at and bonded to an end portion, connected to the second joint, of an edge flexible PCB cable, where the edge flexible PCB cable is a flexible PCB cable connected only to one intermediate rigid support, and the end rigid support part and the intermediate rigid support part are located on opposite sides of the edge flexible PCB cable.

In one or more possible embodiments, a flexible material part on upper layer or a flexible material part on lower layer in each flexible PCB cable includes at least one conducting wire layer, each conducting wire layer includes at least one conducting wire, and each conducting wire is let out through a micro void formed by laser drilling.

According to a second aspect, an embodiment of this application provides a PCB circuit, including:
   the chip-to-module cable assembly according to the first aspect;
   an I/O connector, connected to a main control board through the cable assembly, and configured to: receive first data sent by a signal transmission port of the main control board, send the first data to an external device, receive second data from the external device, and send the second data to a signal receiving port of the main control board through the cable assembly; and
   the main control board, configured to: connect to the I/O connector through the cable assembly, send the first data sent by the signal transmission port to the I/O connector, and receive the second data sent by the I/O connector through the signal receiving port.

According to a third aspect, an embodiment of this application provides a chip-to-module cable assembly, including a first joint, a second joint and a first flexible PCB cable, wherein
   the first joint, comprising a first interface terminal and a second interface terminal, a first end part of the first interface terminal is connected to a first signal port of an I/O connector, and a second end part of the first interface terminal is connected to a first conducting wire in the first flexible PCB cable, a first end part of the second interface terminal is connected to a second signal port of the I/O connector, and a second end part of the second interface terminal is connected to a second conducting wire in the first flexible PCB cable;
   the second joint, comprising a third interface terminal and a fourth interface terminal, a first end part of the third interface terminal is connected to the first conducting wire, and a second end part of the third interface terminal is connected to a first signal port on a main control board, a first end part of the fourth interface terminal is connected to the second conducting wire, and a second end part of the fourth interface terminal is connected to a second signal port on the main control board;
   the first flexible PCB cable, comprising a first flexible material part, a connection part and a second flexible material part, the first flexible material part is located on an upper layer of first flexible PCB cable, the connection part is located on a middle layer of first flexible PCB cable, the first flexible material part is located on a lower layer of first flexible PCB cable, wherein the connection part comprises a first rigid material part, a second rigid material part and a hollow part between the first rigid material part and the second rigid material part, the first flexible material part comprises the first conducting wire, a first end part of the first conducting wire is connected to the first interface terminal, a second end part of the first conducting wire is connected to the third interface terminal, the second flexible material part comprises the second conducting wire, a first end part of the second conducting wire is connected to the second interface terminal, a second end part of the second conducting wire is connected to the fourth interface terminal.

According to a fourth aspect, an embodiment of this application provides a PCB circuit, including a cable assembly, an I/O connector and an main control board, wherein
   the cable assembly comprising a first joint, a second joint and a first flexible PCB cable, wherein the first joint, comprising a first interface terminal and a second interface terminal, a first end part of the first interface terminal is connected to a first signal port of an I/O connector, and a second end part of the first interface terminal is connected to a first conducting wire in the first flexible PCB cable, a first end part of the second interface terminal is connected to a second signal port of the I/O connector, and a second end part of the second interface terminal is connected to a second conducting wire in the first flexible PCB cable;
   the second joint, comprising a third interface terminal and a fourth interface terminal, a first end part of the third interface terminal is connected to the first conducting wire, and a second end part of the third interface terminal is connected to a first signal port on a main control board, a first end part of the fourth interface terminal is connected to the second conducting wire, and a second end part of the fourth interface terminal is connected to a second signal port on the main control board;
   the first flexible PCB cable, comprising a first flexible material part, a connection part and a second flexible material part, the first flexible material part is located on a upper layer of first flexible PCB cable, the connection part is located on a middle layer of first flexible PCB cable, the first flexible material part is located on a lower layer of first flexible PCB cable, wherein the connection part comprises a first rigid material part, a second rigid material part and a hollow part between the first rigid material part and the second rigid material part, the first flexible material part comprises the first conducting wire, a first end part of the first conducting wire is connected to the first interface terminal, a second end part of the first conducting wire is connected to the third interface terminal, the second flexible material part comprises the second conducting wire, a first end part of the second conducting wire is connected to the second interface terminal, a second end part of the second conducting wire is connected to the fourth interface terminal;
   the I/O connector, connected to the main control board through the cable assembly, is configured to send first data to an external device after receiving the first data from the main control board, and send second data to the main control board through the cable assembly after receiving the second data from the external device; and the main control board, connected to the I/O connector through the cable assembly, is configured to send the first data to the I/O connector, and receive the second data from the I/O connector.

According to a fifth aspect, an embodiment of this application provides a communication device, including a cable assembly, an I/O connector and an main control board, wherein the cable assembly comprising a first joint, a second joint and a first flexible PCB cable, wherein the first joint, comprising a first interface terminal and a second interface terminal, a first end part of the first interface terminal is connected to a first signal port of an I/O connector, and a second end part of the first interface terminal is connected to a first conducting wire in the first flexible PCB cable, a first end part of the second interface terminal is connected to a second signal port of the I/O connector, and a second end part of the second interface terminal is connected to a second conducting wire in the first flexible PCB cable;

the second joint, comprising a third interface terminal and a fourth interface terminal, a first end part of the third interface terminal is connected to the first conducting wire, and a second end part of the third interface terminal is connected to a first signal port on a main control board, a first end part of the fourth interface terminal is connected to the second conducting wire, and a second end part of the fourth interface terminal is connected to a second signal port on the main control board;

the first flexible PCB cable, comprising a first flexible material part, a connection part and a second flexible material part, the first flexible material part is located on a upper layer of first flexible PCB cable, the connection part is located on a middle layer of first flexible PCB cable, the first flexible material part is located on a lower layer of first flexible PCB cable, wherein the connection part comprises a first rigid material part, a second rigid material part and a hollow part between the first rigid material part and the second rigid material part, the first flexible material part comprises the first conducting wire, a first end part of the first conducting wire is connected to the first interface terminal, a second end part of the first conducting wire is connected to the third interface terminal, the second flexible material part comprises the second conducting wire, a first end part of the second conducting wire is connected to the second interface terminal, a second end part of the second conducting wire is connected to the fourth interface terminal;

the I/O connector, connected to the main control board through the cable assembly, is configured to send first data to an external device after receiving the first data from the main control board, and send second data to the main control board through the cable assembly after receiving the second data from the external device; and the main control board, connected to the I/O connector through the cable assembly, is configured to send the first data to the I/O connector, and receive the second data from the I/O connector.

The chip-to-module cable assembly and the PCB circuit that are provided in the embodiments of this application have the following beneficial effects.

The chip-to-module cable assembly provided in the embodiments of this application uses the flexible PCB with an improved structure as a cable, resolves a high-speed signal transmission problem in a C2M link compared with a conventional PCB, and resolves feasibility and reliability problems of system assembly under requirements of high density and a large quantity of interconnections compared with a direct attach cable.

DESCRIPTION OF EMBODIMENTS

To make the objectives, technical solutions, and advantages of this application clearer, the following describes this application in detail with reference to the accompanying drawings. Apparently, the described embodiments are merely some but not all of the embodiments of this application. All other embodiments obtained by a person of ordinary skill in the art based on the embodiments of this application without creative efforts shall fall within the protection scope of this application.

Figure 1:
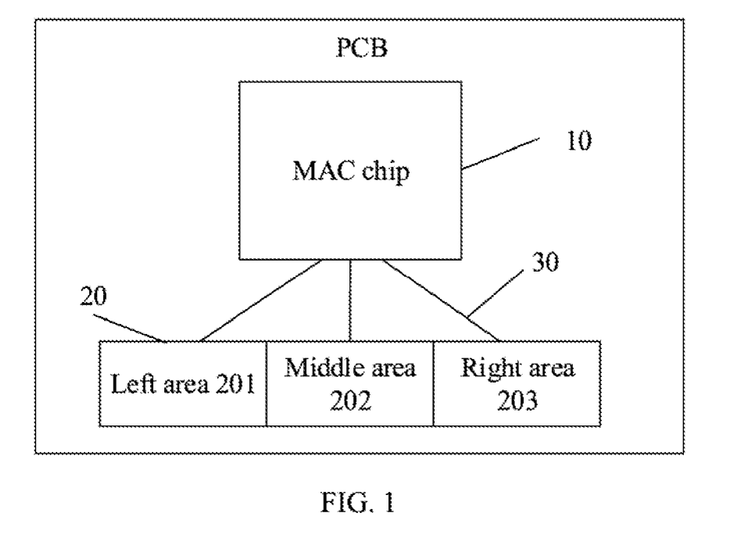
FIG. 1 is a schematic diagram of implementing a C2M channel through inner layer wiring of a multilayer PCB.

A chip-to-module (Chip to module, C2M) physical channel is the most important physical layer interconnection of a communication device. The C2M channel needs to satisfy a channel loss requirement. As shown in FIG. 1, One way to implement the C2M physical channel is to connect a switching chip such as a MAC chip to the I/O connector through copper foil inside a multilayer PCB. In FIG. 1, the MAC chip 10 is in the middle, and the I/O connector 20 is in the lower area. The I/O connector 20 is arranged horizontally, and is divided into three areas: a left area 201, a middle area 202, and a right area 203. A connection line 30 is inner layer wiring of the multilayer PCB. A wiring distance between the MAC chip 10 and the left area 201 is greater than a wiring distance between the MAC chip 10 and the middle area 202, and a wiring distance between the MAC chip 10 and the right area 203 is greater than a wiring distance between the MAC chip 10 and the middle area 202. The MAC chip 10 is connected to the I/O connector 20 through inner layer wiring of the multilayer PCB.

When the foregoing channel connection method is used, a loss of the interconnection channel is determined by a wiring length of the channel, a material property of the board, and a manufacturing process. The foregoing conventional PCB solution may satisfy most C2M applications, but still has its limitation as follows.

In addition to high-speed signal interconnections, the PCB using the MAC chip also needs to carry functions of power supplies and chips, resulting in a relatively large loss (compared with a copper cable). When the speed increases to a high speed greater than a specified speed threshold, the conventional PCB solution gradually fails to satisfy an application of a longer interconnection distance in a system.

With the development of application requirements of big data, cloud computing, AI, and the like, when a C2M speed is increased to a high speed higher than the specified speed threshold, for example, 100 Gb/s, and a PCB loss cannot satisfy the requirement of signal transmission, a cable may be directly connected between the I/O connector and the MAC chip, and is gradually applied to a C2M physical interconnection within a device due to a low loss of the cable. For details, refer to FIG. 2. The middle area is a MAC chip 10, the upper area is an I/O connector 20, and a connection line 30 is a direct attach cable located outside a PCB.

Figure 2:
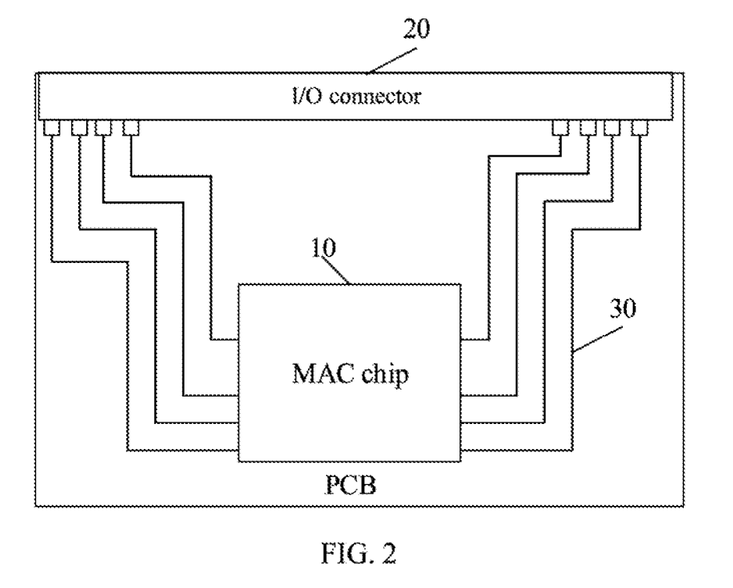
FIG. 2 is a schematic diagram of implementing a C2M channel through a direct attach cable.

A direct attach cable loss is ⅓ or less of a PCB loss. The direct attach cable may be directly connected to the I/O connector and a chip for encapsulation, may satisfy a high-speed transmission requirement, and is an excellent complement to a C2M PCB application. However, the direct attach cable as the C2M channel also has its limitation: due to the large size of the cable, it occupies more space than the inner interconnection of PCB multilayer boards. Therefore, the direct attach cable is not applicable to a scenario in which high density and a large quantity of interconnections exist.

Compared with a copper cable, a flexible PCB has the following advantages: (1) Inner layer wiring of the flexible PCB is dense, which makes wires on a PCB circuit few. (2) Due to a bending yield property, the flexible PCB can be manipulated in various ways to fit edges and folded based on an assembly requirement, and do not affect the assembly reliability due to the resilience after assembly.

Figure 3:
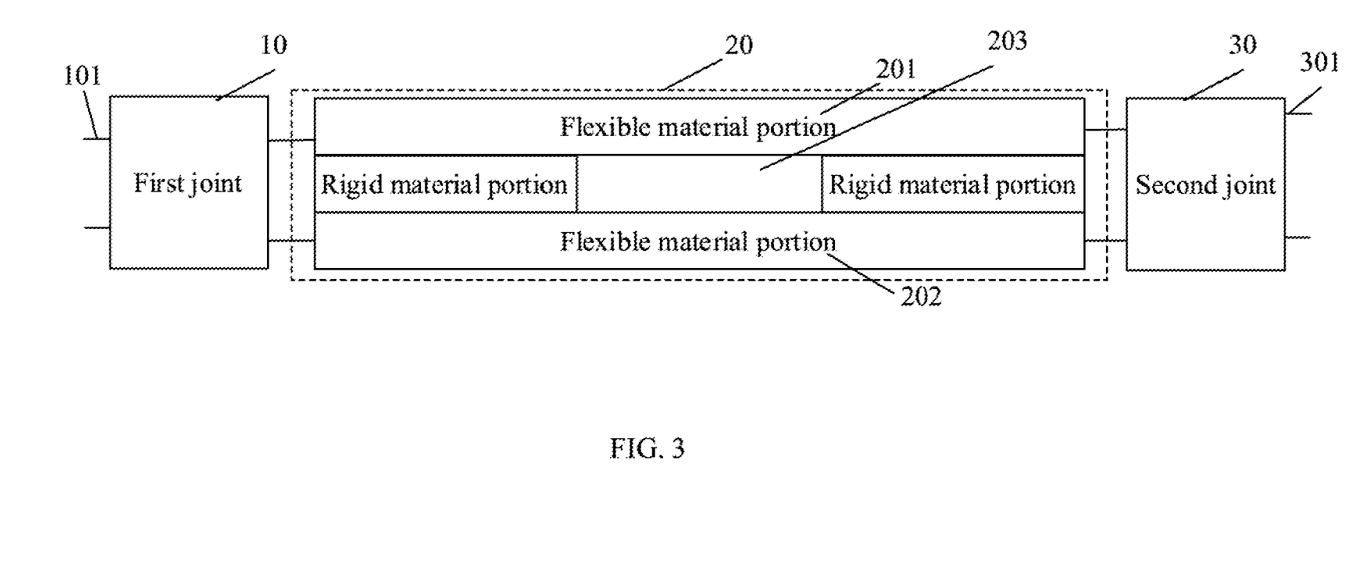
FIG. 3 is a schematic structural diagram of a chip-to-module cable assembly according to an embodiment of this application.

An embodiment of this application provides a chip-to-module cable assembly. As shown in FIG. 3, the cable assembly in this embodiment of this application includes:
- a first joint 10, including a plurality of first interface terminals 101, one end of each first interface terminal is connected to a signal port of an I/O connector, and an other end of the first interface terminal is connected to a conducting wire in a flexible PCB cable 20; and
- the flexible PCB cable 20, including a flexible material part 201 located on the upper layer, a flexible material part 202 located on the lower layer, and a connection portion 203 located on the middle layer, wherein the connection portion 203 includes two rigid material portions respectively located at the end portions of the flexible material parts on the upper and lower layers and a hollow portion between the two rigid material portions, each flexible material part includes at least one conducting wire, one end of each conducting wire is connected to a first interface terminal 101 of the first joint 10, and an other end of the conducting wire is connected to a second interface terminal 301 of a second joint 30.

In this embodiment of this application, the length of the flexible PCB cable can be designed as required, wherein the flexible PCB cable is configured as an intermediate connection portion. The flexible PCB cable can be bent on a PCB. To overcome a problem of a relatively high loss of a conventional flexible board material, a flexible material that may satisfy both a bending requirement and a transmission loss requirement is selected for the flexible PCB cable in this embodiment of this application. In an optional implementation, the material of the flexible PCB cable in this embodiment of this application is poly tetra fluoroethylene (PTFE). PTFE can not only satisfy the bending requirement, but also greatly reduce the loss, and support data transmission at a higher speed.

The flexible PCB cable 20 in this embodiment of this application uses a three-layer structure. The upper layer is a flexible material part, the middle layer is a connection portion, and the lower layer is a flexible material part. The connection portion in the middle is a hollow structure. Two rigid material portions respectively located at end portions are respectively connected to the flexible material part on the upper layer and the flexible material part on the lower layer. Such a structure can be used to provide supporting function at the end portions, and in addition, has a lower requirement on a hole process of the conducting wire. The flexible material part on the upper layer or the lower layer includes at least one conducting wire layer, and each conducting wire layer includes at least one conducting wire. One end portion of each conducting wire is connected to the first interface terminal of the first joint. The first joint may be but is not limited to a rigid portion, and may provide a fastening and supporting function.

The cable assembly further includes the second joint 30, including a plurality of second interface terminals 301. One end of each second interface terminal 301 is connected to a conducting wire in the flexible PCB cable 20, and an other end of the second interface terminal 301 is connected to a signal port on a main control board. The second joint is configured to connect the flexible PCB cable and the main control board. The second joint includes a conducting wire. An end portion of the conducting wire is the second interface terminal.

The second joint is a connection portion including a conducting wire. Two ends of the conducting wire are respectively connected to the signal port on the main control board and the conducting wire in the flexible PCB, the conducting wire can be used to transmit data signal.

The chip-to-module cable assembly provided in this embodiment of this application uses the flexible PCB with an improved structure as a cable, resolves a high-speed signal transmission problem in a C2M link compared with a conventional PCB, and resolves a feasibility problem of system assembly under requirements of high density and a large quantity of interconnections compared with a direct attach cable. Moreover, the flexible PCB cable has a good bending property in the middle, rigid material portions for support at the end portions, and a hole process conducive to the routing of lines.

In one or more possible embodiments, the two rigid material portions are at end portions of the two flexible material parts, and each one of the two rigid material portions is bonded to the end portions of the two flexible material parts on the upper and lower layers. The two rigid material portions may be used to fasten and support the end portions, and facilitate connections of the end portions.

In one or more possible embodiments, at least one conducting wire in the flexible material part on the upper layer is connected to a corresponding first interface terminal at an end portion of the flexible material part on the upper layer through an upward hole, at least one conducting wire in the flexible material part on the lower layer is connected to a corresponding first interface terminal at an end portion of the flexible material part on the lower layer through a downward hole. In this way, the first joint is connected to the flexible PCB cable on two opposite sides of the end portions of the two flexible material parts on the upper and lower layers, so as to play a clamping role. In addition, the hole is vertically upward or downward in each flexible material part, and does not need to run through the entire rigid material. Therefore, the difficulty of the hole process is reduced.

In one or more possible embodiments, at least one conducting wire in the flexible material part on the upper layer is connected to a corresponding second interface terminal at an other end portion of the flexible material part on the upper layer through an upward hole, and at least one conducting wire in the flexible material part on the lower layer is connected to a corresponding second interface terminal at an other end portion of the flexible material part on the lower layer through a downward hole. In this way, the second joint is connected to the flexible PCB cable on two opposite sides of the end portions of the two flexible material parts on the upper and lower layers, so as to play a clamping role. In addition, the hole is vertically upward or downward in each flexible material part, and does not need to run through the entire rigid material. Therefore, the difficulty of the hole process is reduced.

It should be noted that the conducting wires in the flexible material part on the upper layer and on the lower layer may be connected to the corresponding second interface terminal holes on the same side as the conducting wires in the flexible material part on the upper layer and on the lower layer connected to the corresponding first interface port.

The flexible PCB cable may be bendable. There is at least one flexible PCB cable. Each flexible PCB cable is connected to a first joint and a second joint. That is, one flexible PCB cable is connected to a pair of first joint and second joint. This case is suitable for a situation in which holes are located on two opposite sides of end portions of two flexible material parts on the upper and lower layers.

In one or more possible embodiments, the I/O connector may be but is not limited to a QSFP (Quad Small Form-factor Pluggable, quad SFP(Small Form-factor Pluggable) interface/QSFP-DD (Quad Small Form Factor Pluggable-Double Density)/OSFP (Open Shortest Path First)/SFP/SFP+ and the like.

In one or more possible embodiments, the first joint is a golden finger connector, and the golden finger connector includes two first golden fingers, two pads, and an external connection cable. The two first golden fingers are respectively located on sides, perpendicular to the holes, of the two flexible material parts on the upper and lower layers; and one end of each first interface terminal of each first golden finger is connected to a conducting wire in a hole, and an other end of the first interface terminal is fastened by using the pad and is connected to a signal port of the I/O connector through the external connection cable. The golden finger connector as the rigid material can be used to fasten and support the flexible PCB cable. To enhance the fastening effect, in this embodiment of this application, for each flexible PCB cable, on sides, perpendicular to the holes, of the two flexible material parts on the upper and lower layers, the conducting wire is connected to a corresponding first golden finger through a vertical hole. The first golden finger includes a plurality of first interface terminals, and is separately connected to the signal port of the I/O connector and the conducting wire in the flexible PCB through the plurality of first interface terminals. In this embodiment of this application, when the I/O connector is connected to the flexible PCB cable through the first golden finger, the hole process is not needed to be used in the rigid material. Therefore, the difficulty of the hole process is reduced. The external connection cable is located on the sides, perpendicular to the holes, of the two flexible material parts on the upper and lower layers, and extends outward to form the structure of the golden finger connector. The external connection cable may be connected to the signal port of the I/O connector to form a clamping structure, so as to fasten the flexible PCB cable.

In one or more possible embodiments, the second joint includes two second golden fingers, the two second golden fingers are respectively located on sides, perpendicular to the holes, of the two flexible material parts on the upper and lower layers, one end of each second interface terminal of each second golden finger is connected to a conducting wire in a hole, and an other end of the second interface terminal is inserted into a golden finger slot on the main control board and is connected to a signal port on the main control board. Since the main control board has a plurality of golden finger slots on one side. Therefore, at the end at which the flexible PCB cable is connected to one end of the main control board, the conducting wire only needs to connect to the second interface terminal of the second golden finger through the hole, an other end of the second interface terminal of the second golden finger is directly inserted into a golden finger slot on the main control board so as to connect to a corresponding signal port on the main control board. In this embodiment of this application, when the flexible PCB cable is connected to the main control board by using the second golden finger, the hole process is not needed to be used in the rigid material, thereby the difficulty of the hole process is reduced.

Alternatively, in one or more possible embodiments, the second joint is a socket elastic piece, one end of each second interface terminal in the socket elastic piece is connected to a conducting wire in a hole, and an other end of the second interface terminal is inserted into a signal port on the main control board. The main control board may be configured with a corresponding slot. The slot includes a plurality of jacks. Each jack may be connected to an end part of a conducting wire. The conducting wire in the flexible PCB cable is led out and is made into a socket elastic piece. The socket elastic piece is inserted into the slot to connect the flexible PCB cable and the main control board.

Implementations in which the first joint uses the first golden finger connector and the second joint uses the second golden finger or the socket elastic piece are described in detail below.

Embodiment 1

Figure 4:
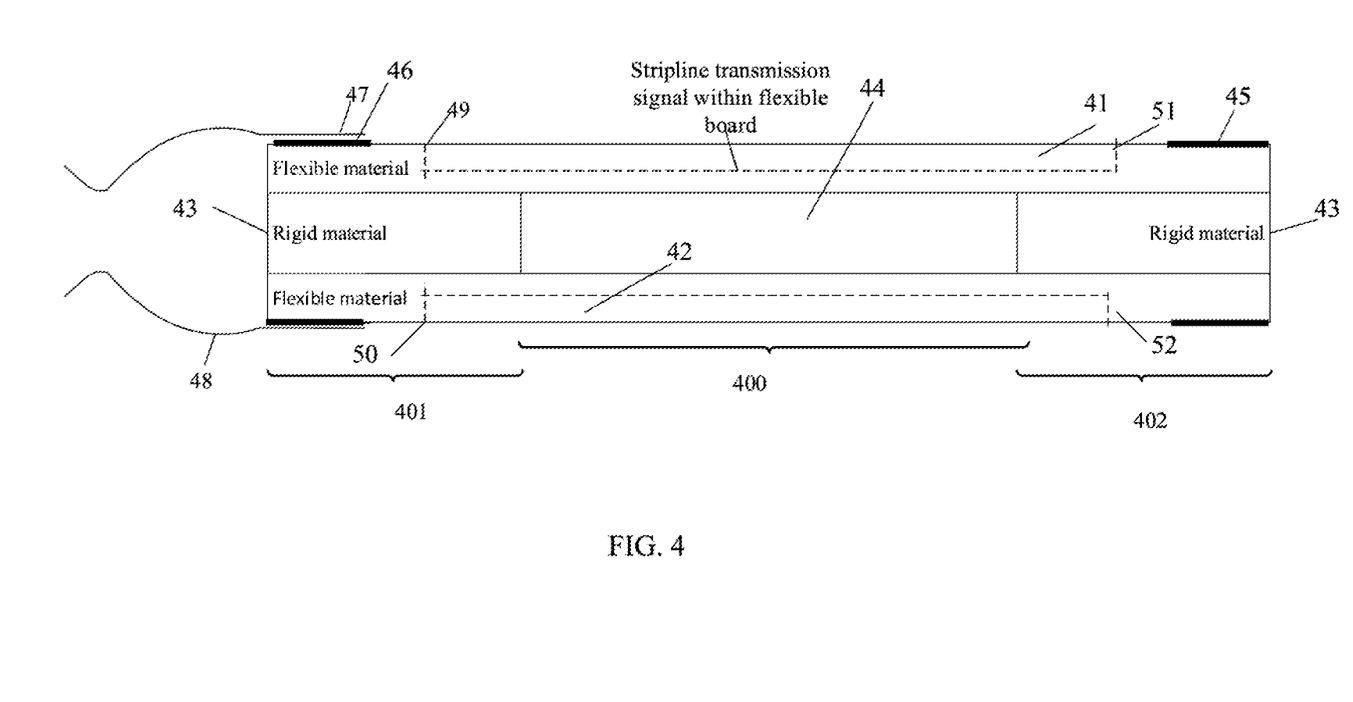
FIG. 4 is a schematic structural diagram of a side section of a cable assembly according to Implementation 1 of this application.

In this embodiment, there is at least one flexible PCB cable. FIG. 4 shows a structure of a flexible PCB cable. The flexible PCB cable includes flexible material parts and a middle layer. The flexible material parts includes a flexible material part 41 on the upper layer and a flexible material part 42 on the lower layer. The middle layer includes two rigid material portions 43 located at end portions of the flexible material part 41 on the upper layer and the flexible material part 42 on the lower layer. A hollow portion 44 is between the two rigid material portions. A first joint uses a golden finger connector structure, configured to connect a signal port of an I/O connector and conducting wires in the flexible material parts, so that a high-speed signal (for example, an optical module) of a module outside a device is connected to the first joint by using the I/O connector. The second joint uses two golden fingers 45, and is connected to a signal port on a main control board. At least one conducting wire in the flexible material part 41 on the upper layer is led out from an upward hole 49 at one end connected to the first joint. At least one conducting wire in the flexible material part 42 on the lower layer is led out from a downward hole 50 at one end connected to the first joint. At least one conducting wire in the flexible material part 41 on the upper layer is led out from an upward hole 51 at one end connected to the second joint. At least one conducting wire in the flexible material part 42 on the lower layer is led out from a downward hole 52 at one end connected to the second joint.

The flexible PCB cable uses two segments of rigid materials in the middle to connect the flexible material part on the upper layer and the flexible material part on the lower layer, and the middle portion is a hollow portion. Therefore, the flexible PCB cable can be divided into a middle portion 400 that is flexible and has a good bending property and a first end portion 401 and a second end portion 402 that are connected to rigid materials at two ends. The rigid materials at the end portions provide a fastening and supporting function, and are more conducive to the connection between the first joint and the second joint.

In this embodiment, the first joint is a golden finger connector. As shown in FIG. 4, the golden finger connector includes two first golden fingers 46, two pads 47, and an external connection cable 48. The two first golden fingers 46 are respectively located on a side, perpendicular to the hole, of the flexible material part 41 on the upper layer, and a side, perpendicular to the hole, of the flexible material part 42 on the lower layer. One end of each first interface terminal of the first golden finger 46 on the upper side is connected to a conducting wire in the hole 49, an other end of the first interface terminal of the first golden finger 46 on the upper side is fastened by using the pad 47 and is connected to a signal port of the I/O connector through the external connection cable 48. One end of each first interface terminal of the first golden finger 46 on the lower side is connected to a conducting wire in the hole 50, and an other end of the first interface terminal of the first golden finger 46 on the lower side is fastened by using the pad 47 and is connected to a signal port of the I/O connector through the external connection cable 48. The external connection cable 48 includes two portions. One portion is connected to the upper first golden finger, and an other portion is connected to the lower first golden finger, thereby forming a clamping structure.

The second joint includes two second golden fingers 45. The two second golden fingers 45 are respectively located on sides, perpendicular to the holes, of the two flexible material parts on the upper and lower layers. The two second golden fingers 45 are respectively located on a side, perpendicular to the hole 51, of the flexible material part 41 on the upper layer and a side, perpendicular to the hole 52, of the flexible material part 42 on the lower layer. The upper and lower positions on two sides are opposite. One end of each second interface terminal of the second golden finger 45 on the upper side is connected to the conducting wire in the hole 51, and an other end is inserted into a golden finger slot on the main control board so as to connect to a signal port on the main control board. One end of each second interface terminal of the second golden finger 45 on the lower side is connected to the conducting wire in the hole 52, and an other end is inserted into a golden finger slot on the main control board so as to connect to a signal port on the main control board.

In this embodiment, a material of the flexible PCB cable 42 may be but is not limited to poly tetra fluoroethylene (PTFE).

Figure 5:
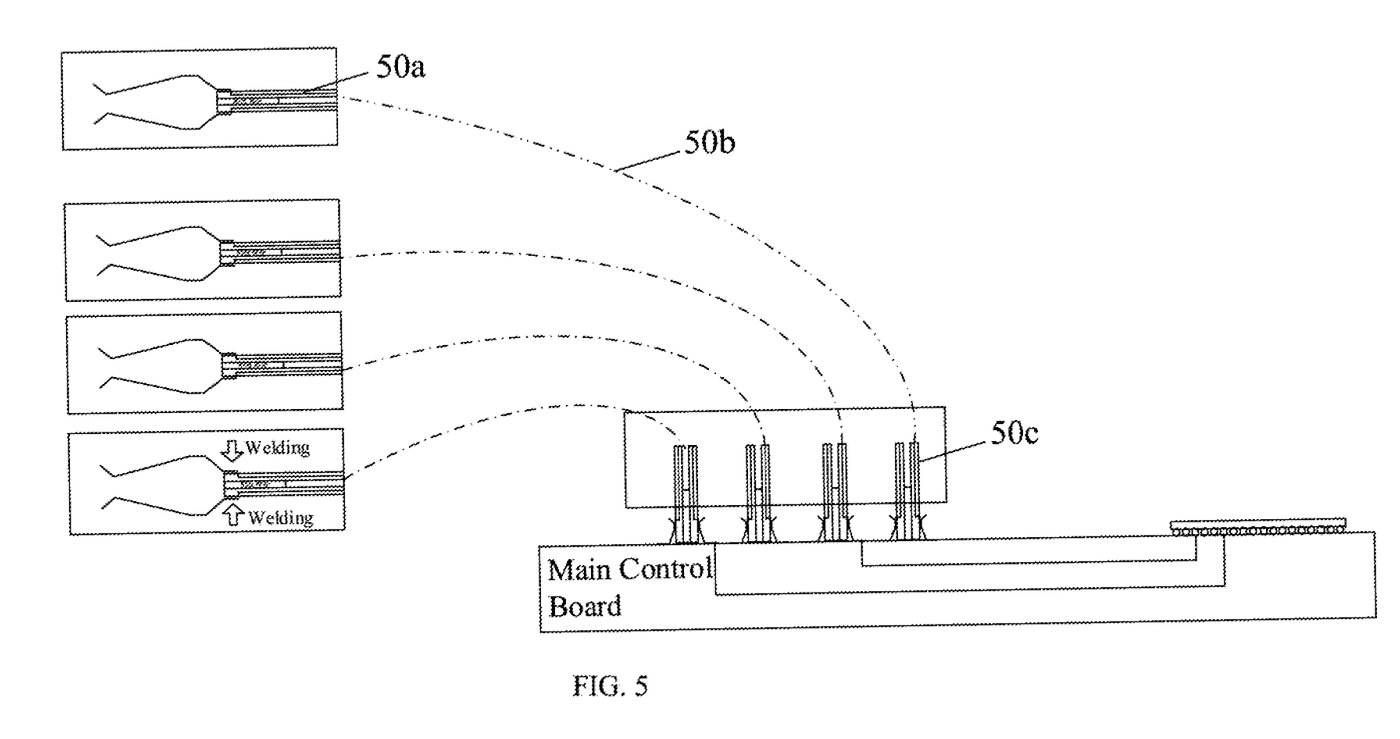
FIG. 5 is a schematic diagram of end portion connections of a cable assembly according to Implementation 1 of this application.

In this embodiment of this application, the flexible PCB cable uses the rigid materials in end portions to bond two flexible material parts on the upper and lower layers. A schematic diagram of how to connect a main control board and an I/O connector by using a plurality of flexible PCB cables is shown in FIG. 5. Each flexible PCB cable includes: a first end portion 50a connected to a first joint, a second end portion 50c connected to the main control board, and a middle portion 50b connected to the first end portion 50a and the second end portion 50c. The first end portion 50a and the second end portion 50c each includes two flexible material parts on the upper and lower layers and a rigid material portion bonded to the two flexible material parts on the upper and lower layers. The middle portion 50b is indicated by using a dashed line. A structure of the middle portion 50b includes a flexible material part on the upper layer, a flexible material part on the lower layer, and a hollow portion as a middle layer. At the first end portion 50a connected to the I/O connector, a clamping structure is formed by using a golden finger connector to connect to signal ports on the I/O connector, and the signal ports may be signal ports on two sides of the I/O connector. At the second end portion 50c connected to the main control board, each flexible PCB cable is inserted into a corresponding golden finger slot through a golden finger. A plurality of golden finger slots are located on a same side of the main control board.

In this embodiment of this application, the rigid materials are bonded to provide structure support function. No signal hole (where a grounding hole may exist) running through the flexible and rigid materials exists, nor does a signal hole running through two flexible PCB cables exist.

Figure 6:
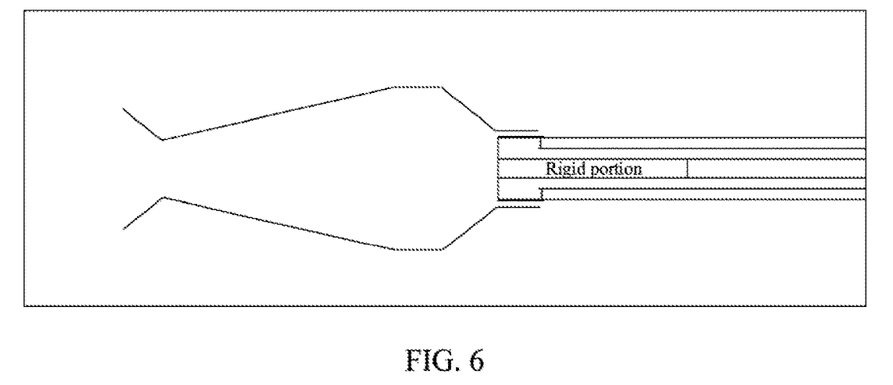
FIG. 6 is an enlarged schematic diagram of a joint according to Implementation 1 of this application.

FIG. 6 is an enlarged schematic diagram illustrating how a golden finger connector is connected to a flexible PCB cable.

In this embodiment of this application, the foregoing first golden finger and the foregoing second golden finger can implement various I/O standards (SFP, QSFP, OSFP, and the like). External connection cable end parts of the golden finger connector are respectively located on upper and lower sides of an end portion of the flexible material parts, forming a golden finger clamping structure at a circuit edge.

In this embodiment of this application, the flexible PCB cable uses a double-sided golden finger connection manner. The golden finger connector, as a cable port, is separately connected to a main control board and an I/O connector.

In this embodiment of this application, the first golden finger is connected to an external connection cable through welding to a pad. There may be a plurality of layers of conducting wires in the flexible material part. Each layer includes at least one conducting wire. Each conducting wire is led out through a hole. The hole may be a micro void formed through laser drilling. The laser drilling has high accuracy. This application reduces a CTE(coefficient of thermal expansion) requirement of a flexible material, so that a material with a low loss and high CTE can be selected.

By using the cable assembly of the foregoing structure, the rigid portions provide a structure support function. The rigid portion and the flexible portion can be combined without a conventional high temperature pressing process, thereby reducing a manufacturability requirement for a flexible material.

Embodiment 2

Figure 7:
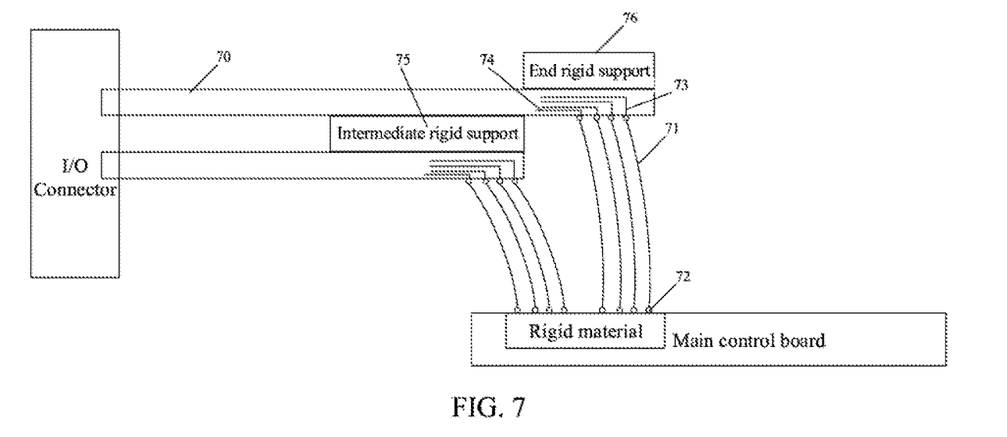
FIG. 7 is a schematic structural diagram of a cable assembly according to Implementation 2 of this application.

A flexible PCB cable in a cable assembly in this embodiment of this application has a same structure as the flexible PCB cable in the foregoing implementation. Details about the structure of the flexible PCB cable are not described herein again. The first joints in this implementation have a same structure with the foregoing implementation. The second joints in this implementation have a different structure with the foregoing implementation. As shown in FIG. 7, a plurality of flexible PCB cables 70 are used. Each flexible PCB cable is connected to an I/O connector through the first joint. Since the structure of the flexible PCB board cable connected to IO connectors through the first joint is the same as Implementation 1, detailed illustrations and text descriptions are not provided herein again.

In this embodiment of this application, the second joint is a socket elastic piece 71. All second interface terminals in the socket elastic piece 71 are located on a same side of the flexible PCB cable. One end of each second interface terminal is connected to a conducting wire in a hole, and another end of the second interface terminal is inserted into a signal port 72 on the main control board. In this embodiment of this application, at the second joint, holes in the flexible material parts are located on a same side. At least one conducting wire 73 in the flexible material part on the upper layer is connected to a corresponding second interface terminal through a downward hole. At least one conducting wire 74 in the flexible material part on the lower layer is connected, through a downward hole, to a corresponding second interface terminal at an end portion of the flexible material part on the lower layer.

In this embodiment, a material of the flexible PCB cable may be but is not limited to poly tetra fluoroethylene (PTFE).

In this embodiment, there are a plurality of flexible PCB cables, and the second joint is a socket elastic piece. To improve the stability of a plurality of flexible PCB cables, the cable assembly further includes:

an intermediate rigid support part 75, located between and bonded to end portions, connected to the second joint, of the neighboring flexible PCB cables; and an end rigid support part 76, located at and bonded to an end portion, connected to the second joint, of an edge flexible PCB cable, wherein the edge flexible PCB cable is a flexible PCB cable connected only to one intermediate rigid support, and the end rigid support part 76 and the intermediate rigid support part 75 are located on opposite sides of the edge flexible PCB cable.

In this embodiment of this application, the foregoing first golden finger and the foregoing second golden finger can implement various I/O standards (SFP, QSFP, OSFP, and the like). External connection cable end parts of the golden finger connector are respectively located on upper and lower sides of an end portion of flexible material parts, forming a golden finger clamping structure at a circuit edge.

In this embodiment of this application, the first golden finger is connected to an external connection cable through welding to a pad. There may be a plurality of layers of conducting wires in the flexible material part. Each layer includes at least one conducting wire. Each conducting wire is led out through a hole. The hole may be a micro void formed through laser drilling. The laser drilling has high accuracy. This application reduces a CTE requirement on a flexible material, so that a material with a low loss and high CTE can be selected.

In each flexible PCB cable in the embodiments of this application, two layers of flexible material parts are combined on rigid material portions. Inner layer signals of the flexible material parts of the flexible PCB cable are not connected (except being grounded) through the holes running through the rigid material. The flexible material parts guide inner layer signals into an outer layer through micro voids formed by laser, and expose inner layer signals of a flexible multilayer PCB to the outside of the cable in a ladder mode.

The flexible PCB cable is connected, by using a socket elastic piece, to a PCB on which a chip is located. The socket elastic piece uses two or more height-adapted cables.

Figure 8:
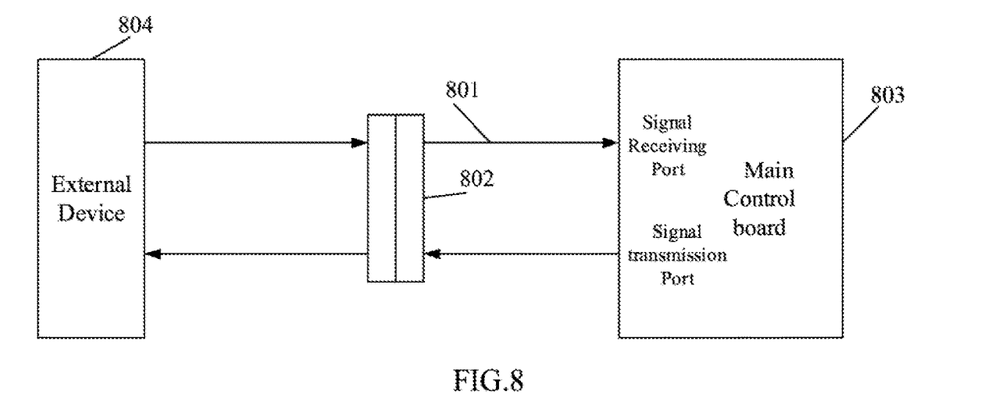
FIG. 8 is a schematic diagram of a PCB circuit according to an embodiment of this application.

Based on a same inventive concept, an embodiment of this application further provides a PCB circuit, as shown in FIG. 8, including:

the chip-to-module cable assembly 801 according to the foregoing embodiment of this application;

an I/O connector 802, connected to a main control board 803 through the cable assembly 801, and configured to: receive first data sent by a signal transmission port of the main control board 803, send the first data to an external device 804, receive second data from the external device 804, and send the second data to a signal receiving port of the main control board 803 through the cable assembly; and the main control board 803, configured to: connect to the I/O connector 802 through the cable assembly 801, send the first data sent by the signal transmission port to the I/O connector 802, and receive the second data sent by the I/O connector 802 through the signal receiving port.

Embodiment 3

A chip-to-module cable assembly is provided as an embodiment of this disclosure, including a first joint, a second joint and a first flexible PCB cable, wherein the first joint, comprising a first interface terminal and a second interface terminal, a first end part of the first interface terminal is connected to a first signal port of an I/O connector, and a second end part of the first interface terminal is connected to a first conducting wire in the first flexible PCB cable, a first end part of the second interface terminal is connected to a second signal port of the I/O connector, and a second end part of the second interface terminal is connected to a second conducting wire in the first flexible PCB cable;

the second joint, comprising a third interface terminal and a fourth interface terminal, a first end part of the third interface terminal is connected to the first conducting wire, and a second end part of the third interface terminal is connected to a first signal port on a main control board, a first end part of the fourth interface terminal is connected to the second conducting wire, and a second end part of the fourth interface terminal is connected to a second signal port on the main control board;

the first flexible PCB cable, comprising a first flexible material part, a connection part and a second flexible material part, the first flexible material part is located on an upper layer of first flexible PCB cable, the connection part is located on a middle layer of first flexible PCB cable, the first flexible material part is located on a lower layer of first flexible PCB cable, wherein the connection part comprises a first rigid material part, a second rigid material part and a hollow part between the first rigid material part and the second rigid material part, the first flexible material part comprises the first conducting wire, a first end part of the first conducting wire is connected to the first interface terminal, a second end part of the first conducting wire is connected to the third interface terminal, the second flexible material part comprises the second conducting wire, a first end part of the second conducting wire is connected to the second interface terminal, a second end part of the second conducting wire is connected to the fourth interface terminal.

In this embodiment of this application, the first rigid material part is located between a first end part of the first flexible material part and a first end part of the second flexible material part, the second rigid material part is located between a second end part of the first flexible material part and a second end part of the second flexible material part.

In this embodiment of this application, the first conducting wire passes through an upward first hole to connect to the first interface terminal at the first end part of the first flexible material part, the second conducting wire passes through a downward second hole to connect to the second interface terminal at the first end part of the second flexible material part.

In this embodiment of this application, the first conducting wire passes through an upward third hole to connect to the third interface terminal at the second end part of the first flexible material part, the second conducting wire passes through a downward fourth hole to connect to the fourth interface terminal at the second end part of the second flexible material part.

In this embodiment of this application, the first joint is a golden finger connector, and the golden finger connector comprises a first golden finger, a second golden finger, a first pad, a second pad, a first external connection cable and a second external connection cable, wherein the first golden finger is located at the first end part of the first flexible material part and is perpendicular to the first hole, the first golden finger comprises the first interface terminal, the second end part of the first interface terminal passes through the first hole to connect to the first conducting wire, the first end part of the first interface terminal is fastened by the first pad and is connected to the first signal port of the I/O connector through the first external connection cable;
the second golden finger is located at the first end part of the second flexible material part and is perpendicular to the second hole, the second golden finger comprises the second interface terminal, the second end part of the second interface terminal passes through the second hole to connect to the second conducting wire, the first end part of the second interface terminal is fastened by the second pad and is connected to the second signal port of the I/O connector through the second external connection cable.

In this embodiment of this application, the second joint comprises a third golden finger and a fourth golden finger, the third golden finger is located at the second end part of the first flexible material part and is perpendicular to the third hole, the third golden finger comprises the third interface terminal, the first end part of the third interface terminal passes through the third hole to connect to the first conducting wire, the second end part of the third interface terminal is inserted into a first golden finger slot on the main control board so as to connect to the first signal port on the main control board;
the fourth golden finger is located at the second end part of the second flexible material part and is perpendicular to the fourth hole, the fourth golden finger comprises the fourth interface terminal, the first end part of the fourth interface terminal passes through the fourth hole to connect to the second conducting wire, the second end part of the fourth interface terminal is inserted into a second golden finger slot on the main control board so as to connect to the second signal port on the main control board.

In this embodiment of this application, the second joint is a socket elastic piece, the socket elastic piece comprises the third interface terminal and the fourth interface terminal, the first end part of the third interface terminal passes through a downward fifth hole to connect to the first conducting wire, the second end part of the third interface terminal is inserted into the first signal port on the main control; the first end part of the fourth interface terminal passes through a downward sixth hole to connect to the second conducting wire, the second end part of the fourth interface terminal is inserted into the second signal port on the main control.

In this embodiment of this application, the cable assembly comprises a second flexible PCB cable, the first flexible PCB cable is connected to the second joint at a first end part of the first flexible PCB cable, the second flexible PCB cable is connected to the second joint at a first end part of the second flexible PCB cable, wherein the cable assembly comprises:
an intermediate rigid support part, located between the first end part of the first flexible PCB cable and the first end part of the second flexible PCB cable;
an end rigid support part, located at the first end part of the first flexible PCB cable, wherein the intermediate rigid support part and the end rigid support part are located on opposite sides of the first flexible PCB cable, the first flexible PCB cable is a flexible PCB cable connected only to one intermediate rigid support part.

In this embodiment of this application, the first flexible material part comprises a first conducting wire layer, the first conducting wire layer comprises the first conducting wire, the first conducting wire is let out through a micro void formed by laser drilling; the second flexible material part comprises a second conducting wire layer, the second conducting wire layer comprises the second conducting wire, the second conducting wire is let out through a micro void formed by laser drilling.

A PCB circuit is provided as an embodiment of this disclosure, including a cable assembly, an I/O connector and an main control board, wherein
the cable assembly comprising a first joint, a second joint and a first flexible PCB cable, wherein the first joint, comprising a first interface terminal and a second interface terminal, a first end part of the first interface terminal is connected to a first signal port of an I/O connector, and a second end part of the first interface terminal is connected to a first conducting wire in the first flexible PCB cable, a first end part of the second interface terminal is connected to a second signal port of the I/O connector, and a second end part of the second interface terminal is connected to a second conducting wire in the first flexible PCB cable;
the second joint, comprising a third interface terminal and a fourth interface terminal, a first end part of the third interface terminal is connected to the first conducting wire, and a second end part of the third interface terminal is connected to a first signal port on a main control board, a first end part of the fourth interface terminal is connected to the second conducting wire, and a second end part of the fourth interface terminal is connected to a second signal port on the main control board;
the first flexible PCB cable, comprising a first flexible material part, a connection part and a second flexible material part, the first flexible material part is located on a upper layer of first flexible PCB cable, the connection part is located on a middle layer of first flexible PCB cable, the first flexible material part is located on a lower layer of first flexible PCB cable, wherein the connection part comprises a first rigid material part, a second rigid material part and a hollow part between the first rigid material part and the second rigid material part, the first flexible material part comprises the first conducting wire, a first end part of the first conducting wire is connected to the first interface terminal, a second end part of the first conducting wire is connected to the third interface terminal, the second flexible material part comprises the second conducting wire, a first end part of the second conducting wire is connected to the second interface terminal, a second end part of the second conducting wire is connected to the fourth interface terminal;

the I/O connector, connected to the main control board through the cable assembly, is configured to send first data to an external device after receiving the first data from the main control board, and send second data to the main control board through the cable assembly after receiving the second data from the external device; and the main control board, connected to the I/O connector through the cable assembly, is configured to send the first data to the I/O connector, and receive the second data from the I/O connector.

In this embodiment of this application, the first rigid material part is located between a first end part of the first flexible material part and a first end part of the second flexible material part, the second rigid material part is located between a second end part of the first flexible material part and a second end part of the second flexible material part.

In this embodiment of this application, the first conducting wire passes through an upward first hole to connect to the first interface terminal at the first end part of the first flexible material part, the second conducting wire passes through an downward second hole to connect to the second interface terminal at the first end part of the second flexible material part.

In this embodiment of this application, the first conducting wire passes through an upward third hole to connect to the third interface terminal at the second end part of the first flexible material part, the second conducting wire passes through an downward fourth hole to connect to the fourth interface terminal at the second end part of the second flexible material part.

In this embodiment of this application, the first joint is a golden finger connector, and the golden finger connector comprises a first golden finger, a second golden finger, a first pad, a second pad, a first external connection cable and a second external connection cable, wherein the first golden finger is located at the first end part of the first flexible material part and is perpendicular to the first hole, the first golden finger comprises the first interface terminal, the second end part of the first interface terminal passes through the first hole to connect to the first conducting wire, the first end part of the first interface terminal is fastened by the first pad and is connected to the first signal port of the I/O connector through the first external connection cable;

the second golden finger is located at the first end part of the second flexible material part and is perpendicular to the second hole, the second golden finger comprises the second interface terminal, the second end part of the second interface terminal passes through the second hole to connect to the second conducting wire, the first end part of the second interface terminal is fastened by the second pad and is connected to the second signal port of the I/O connector through the second external connection cable.

In this embodiment of this application, the second joint comprises a third golden finger and a fourth golden finger, the third golden finger is located at the second end part of the first flexible material part and is perpendicular to the third hole, the third golden finger comprises the third interface terminal, the first end part of the third interface terminal passes through the third hole to connect to the first conducting wire, the second end part of the third interface terminal is inserted into a first golden finger slot on the main control board so as to connect to the first signal port on the main control board;

the fourth golden finger is located at the second end part of the second flexible material part and is perpendicular to the fourth hole, the fourth golden finger comprises the fourth interface terminal, the first end part of the fourth interface terminal passes through the fourth hole to connect to the second conducting wire, the second end part of the fourth interface terminal is inserted into a second golden finger slot on the main control board so as to connect to the second signal port on the main control board.

In this embodiment of this application, the second joint is a socket elastic piece, the socket elastic piece comprises the third interface terminal and the fourth interface terminal, the first end part of the third interface terminal passes through a downward fifth hole to connect to the first conducting wire, the second end part of the third interface terminal is inserted into the first signal port on the main control; the first end part of the fourth interface terminal passes through a downward sixth hole to connect to the second conducting wire, the second end part of the fourth interface terminal is inserted into the second signal port on the main control.

In this embodiment of this application, the cable assembly comprises a second flexible PCB cable, the first flexible PCB cable is connected to the second joint at a first end part of the first flexible PCB cable, the second flexible PCB cable is connected to the second joint at a first end part of the second flexible PCB cable, wherein the cable assembly comprises:

an intermediate rigid support part, located between the first end part of the first flexible PCB cable and the first end part of the second flexible PCB cable;

an end rigid support part, located at the first end part of the first flexible PCB cable, wherein the intermediate rigid support part and the end rigid support part are located on opposite sides of the first flexible PCB cable, the first flexible PCB cable is a flexible PCB cable connected only to one intermediate rigid support part.

A communication device is provided as an embodiment of this disclosure, including a cable assembly, an I/O connector and an main control board, wherein the cable assembly comprising a first joint, a second joint and a first flexible PCB cable, wherein the first joint, comprising a first interface terminal and a second interface terminal, a first end part of the first interface terminal is connected to a first signal port of an I/O connector, and a second end part of the first interface terminal is connected to a first conducting wire in the first flexible PCB cable, a first end part of the second interface terminal is connected to a second signal port of the I/O connector, and a second end part of the second interface terminal is connected to a second conducting wire in the first flexible PCB cable;

the second joint, comprising a third interface terminal and a fourth interface terminal, a first end part of the third interface terminal is connected to the first conducting wire, and a second end part of the third interface terminal is connected to a first signal port on a main control board, a first end part of the fourth interface terminal is connected to the second conducting wire, and a second end part of the fourth interface terminal is connected to a second signal port on the main control board;

the first flexible PCB cable, comprising a first flexible material part, a connection part and a second flexible material part, the first flexible material part is located on a upper layer of first flexible PCB cable, the connection part is located on a middle layer of first flexible PCB cable, the first flexible material part is located on a lower layer of first flexible PCB cable, wherein the connection part comprises a first rigid material part, a second rigid material part and a hollow part between the first rigid material part and the second rigid material part, the first flexible material part comprises the first conducting wire, a first end part of the first conducting wire is connected to the first interface terminal, a second end part of the first conducting wire is connected to the third interface terminal, the second flexible material part comprises the second conducting wire, a first end part of the second conducting wire is connected to the second interface terminal, a second end part of the second conducting wire is connected to the fourth interface terminal;

the I/O connector, connected to the main control board through the cable assembly, is configured to send first data to an external device after receiving the first data from the main control board, and send second data to the main control board through the cable assembly after receiving the second data from the external device; and the main control board, connected to the I/O connector through the cable assembly, is configured to send the first data to the I/O connector, and receive the second data from the I/O connector.

In this embodiment of this application, the first rigid material part is located between a first end part of the first flexible material part and a first end part of the second flexible material part, the second rigid material part is located between a second end part of the first flexible material part and a second end part of the second flexible material part.

In this embodiment of this application, the cable assembly comprises a second flexible PCB cable, the first flexible PCB cable is connected to the second joint at a first end part of the first flexible PCB cable, the second flexible PCB cable is connected to the second joint at a first end part of the second flexible PCB cable, wherein the cable assembly comprises:

an intermediate rigid support part, located between the first end part of the first flexible PCB cable and the first end part of the second flexible PCB cable;

an end rigid support part, located at the first end part of the first flexible PCB cable, wherein the intermediate rigid support part and the end rigid support part are located on opposite sides of the first flexible PCB cable, the first flexible PCB cable is a flexible PCB cable connected only to one intermediate rigid support part.

Obviously, persons skilled in the art can make various modifications and variations to the embodiments of this application without departing from the spirit and scope of the embodiments of the application. In this way, if these modifications and variations of the embodiments of this application fall within the scope of the claims of this application and their equivalent technologies, this application is also intended to include these modifications and variations.

What is claimed is:

1. A chip-to-module cable assembly, comprising a first joint, a second joint and a first flexible PCB cable, wherein
the first joint comprises a first interface terminal and a second interface terminal, a first end part of the first interface terminal is connected to a first signal port of an I/O connector, and a second end part of the first interface terminal is connected to a first conducting wire in the first flexible PCB cable, a first end part of the second interface terminal is connected to a second signal port of the I/O connector, and a second end part of the second interface terminal is connected to a second conducting wire in the first flexible PCB cable;
the second joint comprises a third interface terminal and a fourth interface terminal, a first end part of the third interface terminal is connected to the first conducting wire, and a second end part of the third interface terminal is connected to a first signal port on a main control board, a first end part of the fourth interface terminal is connected to the second conducting wire, and a second end part of the fourth interface terminal is connected to a second signal port on the main control board; and
the first flexible PCB cable comprises a first flexible material part, a connection part and a second flexible material part, the first flexible material part is located on an upper layer of the first flexible PCB cable, the connection part is located on a middle layer of the first flexible PCB cable, the second flexible material part is located on a lower layer of the first flexible PCB cable, wherein the connection part comprises a first rigid material part, a second rigid material part and a hollow part between the first rigid material part and the second rigid material part, the first flexible material part comprises the first conducting wire, a first end part of the first conducting wire is connected to the first interface terminal, a second end part of the first conducting wire is connected to the third interface terminal, the second flexible material part comprises the second conducting wire, a first end part of the second conducting wire is connected to the second interface terminal, and a second end part of the second conducting wire is connected to the fourth interface terminal;
wherein the first rigid material part is located between a first end part of the first flexible material part and a first end part of the second flexible material part, and the second rigid material part is located between a second end part of the first flexible material part and a second end part of the second flexible material part; and
wherein the first conducting wire passes through an upward first hole to connect to the first interface terminal at the first end part of the first flexible material part, and the second conducting wire passes through a downward second hole to connect to the second interface terminal at the first end part of the second flexible material part.

2. The cable assembly according to claim 1, wherein the first joint is a golden finger connector, and the golden finger connector comprises a first golden finger, a second golden finger, a first pad, a second pad, a first external connection cable and a second external connection cable, wherein the first golden finger is located at the first end part of the first flexible material part and is perpendicular to the first hole, the first golden finger comprises the first interface terminal, the second end part of the first interface terminal passes through the first hole to connected to the first conducting wire, and the first end part of the first interface terminal is fastened by the first pad and is connected to the first signal port of the I/O connector through the first external connection cable; and     the second golden finger is located at the first end part of the second flexible material part and is perpendicular to the second hole, the second golden finger comprises the second interface terminal, the second end part of the second interface terminal passes through the second hole to connect to the second conducting wire, and the first end part of the second interface terminal is fastened by the second pad and is connected to the second signal port of the I/O connector through the second external connection cable.

3. The cable assembly according to claim 1, wherein the first conducting wire passes through an upward third hole to connect to the third interface terminal at the second end part of the first flexible material part, and the second conducting wire passes through a downward fourth hole to connect to the fourth interface terminal at the second end part of the second flexible material part.

4. The cable assembly according to claim 3, wherein the second joint comprises a third golden finger and a fourth golden finger, the third golden finger is located at the second end part of the first flexible material part and is perpendicular to the third hole, the third golden finger comprises the third interface terminal, the first end part of the third interface terminal passes through the third hole to connect to the first conducting wire, and the second end part of the third interface terminal is inserted into a first golden finger slot on the main control board so as to connect to the first signal port on the main control board; and     the fourth golden finger is located at the second end part of the second flexible material part and is perpendicular to the fourth hole, the fourth golden finger comprises the fourth interface terminal, the first end part of the fourth interface terminal passes through the fourth hole to connect to the second conducting wire, and the second end part of the fourth interface terminal is inserted into a second golden finger slot on the main control board so as to connect to the second signal port on the main control board.

5. The cable assembly according to claim 1, wherein the second joint is a socket elastic piece, the socket elastic piece comprises the third interface terminal and the fourth interface terminal, the first end part of the third interface terminal passes through a downward fifth hole to connect to the first conducting wire, and the second end part of the third interface terminal is inserted into the first signal port on the main control; and     the first end part of the fourth interface terminal passes through a downward sixth hole to connect to the second conducting wire, and the second end part of the fourth interface terminal is inserted into the second signal port on the main control.

6. The cable assembly according to claim 1, wherein the cable assembly comprises a second flexible PCB cable, the first flexible PCB cable is connected to the second joint at a first end part of the first flexible PCB cable, the second flexible PCB cable is connected to the second joint at a first end part of the second flexible PCB cable, wherein the cable assembly comprises:

an intermediate rigid support part, located between the first end part of the first flexible PCB cable and the first end part of the second flexible PCB cable; and     an end rigid support part, located at the first end part of the first flexible PCB cable, wherein the intermediate rigid support part and the end rigid support part are located on opposite sides of the first flexible PCB cable, and the first flexible PCB cable is a flexible PCB cable connected only to one intermediate rigid support part.

7. The cable assembly according to claim 1, wherein the first flexible material part comprises a first conducting wire layer, the first conducting wire layer comprises the first conducting wire, and the first conducting wire is let out through a micro void formed by laser drilling; and the second flexible material part comprises a second conducting wire layer, the second conducting wire layer comprises the second conducting wire, and the second conducting wire is let out through a micro void formed by laser drilling.

8. A communication device, comprising a cable assembly, an I/O connector and a main control board, wherein     the cable assembly comprises a first joint, a second joint and a first flexible PCB cable, wherein the first joint comprises a first interface terminal and a second interface terminal, a first end part of the first interface terminal is connected to a first signal port of an I/O connector, and a second end part of the first interface terminal is connected to a first conducting wire in the first flexible PCB cable, a first end part of the second interface terminal is connected to a second signal port of the I/O connector, and a second end part of the second interface terminal is connected to a second conducting wire in the first flexible PCB cable;

the second joint comprises a third interface terminal and a fourth interface terminal, a first end part of the third interface terminal is connected to the first conducting wire, and a second end part of the third interface terminal is connected to a first signal port on a main control board, a first end part of the fourth interface terminal is connected to the second conducting wire, and a second end part of the fourth interface terminal is connected to a second signal port on the main control board;

the first flexible PCB cable comprises a first flexible material part, a connection part and a second flexible material part, the first flexible material part is located on a upper layer of the first flexible PCB cable, the connection part is located on a middle layer of the first flexible PCB cable, and the second flexible material part is located on a lower layer of the first flexible PCB cable, wherein the connection part comprises a first rigid material part, a second rigid material part and a hollow part between the first rigid material part and the second rigid material part, the first flexible material part comprises the first conducting wire, a first end part of the first conducting wire is connected to the first interface terminal, a second end part of the first conducting wire is connected to the third interface terminal, the second flexible material part comprises the second conducting wire, a first end part of the second conducting wire is connected to the second interface terminal, and a second end part of the second conducting wire is connected to the fourth interface terminal;

the I/O connector, connected to the main control board through the cable assembly, is configured to send first data to an external device after receiving the first data from the main control board, and send second data to the main control board through the cable assembly after receiving the second data from the external device; and the main control board, connected to the I/O connector through the cable assembly, is configured to send the first data to the I/O connector, and receive the second data from the I/O connector;

wherein the first rigid material part is located between a first end part of the first flexible material part and a first end part of the second flexible material part, the second rigid material part is located between a second end part of the first flexible material part and a second end part of the second flexible material part; and wherein the first conducting wire passes through an upward first hole to connect to the first interface terminal at the first end part of the first flexible material part, the second conducting wire passes through a downward second hole to connect to the second interface terminal at the first end part of the second flexible material part.

9. The communication device according to claim 8, wherein the cable assembly comprises a second flexible PCB cable, the first flexible PCB cable is connected to the second joint at a first end part of the first flexible PCB cable, the second flexible PCB cable is connected to the second joint at a first end part of the second flexible PCB cable, wherein the cable assembly comprises:

an intermediate rigid support part, located between the first end part of the first flexible PCB cable and the first end part of the second flexible PCB cable; and an end rigid support part, located at the first end part of the first flexible PCB cable, wherein the intermediate rigid support part and the end rigid support part are located on opposite sides of the first flexible PCB cable, and the first flexible PCB cable is a flexible PCB cable connected only to one intermediate rigid support part.

10. The communication device according to claim 8, wherein the first conducting wire passes through an upward third hole to connect to the third interface terminal at the second end part of the first flexible material part, and the second conducting wire passes through a downward fourth hole to connect to the fourth interface terminal at the second end part of the second flexible material part.

11. The communication device according to claim 10, wherein the second joint comprises a third golden finger and a fourth golden finger, the third golden finger is located at the second end part of the first flexible material part and is perpendicular to the third hole, the third golden finger comprises the third interface terminal, the first end part of the third interface terminal passes through the third hole to connect to the first conducting wire, and the second end part of the third interface terminal is inserted into a first golden finger slot on the main control board so as to be connected to the first signal port on the main control board; and the fourth golden finger is located at the second end part of the second flexible material part and is perpendicular to the fourth hole, the fourth golden finger comprises the fourth interface terminal, the first end part of the fourth interface terminal passes through the fourth hole to connect to the second conducting wire, and the second end part of the fourth interface terminal is inserted into a second golden finger slot on the main control board so as to be connected to the second signal port on the main control board.

12. The communication device according to claim 8, wherein the first joint is a golden finger connector, and the golden finger connector comprises a first golden finger, a second golden finger, a first pad, a second pad, a first external connection cable and a second external connection cable, wherein the first golden finger is located at the first end part of the first flexible material part and is perpendicular to the first hole, the first golden finger comprises the first interface terminal, the second end part of the first interface terminal passes through the first hole to connect to the first conducting wire, and the first end part of the first interface terminal is fastened by the first pad and is connected to the first signal port of the I/O connector through the first external connection cable; and the second golden finger is located at the first end part of the second flexible material part and is perpendicular to the second hole, the second golden finger comprises the second interface terminal, the second end part of the second interface terminal passes through the second hole to connect to the second conducting wire, and the first end part of the second interface terminal is fastened by the second pad and is connected to the second signal port of the I/O connector through the second external connection cable.

13. A chip-to-module cable assembly, comprising a first joint, a second joint and a first flexible PCB cable, wherein the first joint comprises a first interface terminal and a second interface terminal, a first end part of the first interface terminal is connected to a first signal port of an I/O connector, and a second end part of the first interface terminal is connected to a first conducting wire in the first flexible PCB cable, a first end part of the second interface terminal is connected to a second signal port of the I/O connector, and a second end part of the second interface terminal is connected to a second conducting wire in the first flexible PCB cable;

the second joint comprises a third interface terminal and a fourth interface terminal, a first end part of the third interface terminal is connected to the first conducting wire, and a second end part of the third interface terminal is connected to a first signal port on a main control board, a first end part of the fourth interface terminal is connected to the second conducting wire, and a second end part of the fourth interface terminal is connected to a second signal port on the main control board; and the first flexible PCB cable comprises a first flexible material part, a connection part and a second flexible material part, the first flexible material part is located on an upper layer of the first flexible PCB cable, the connection part is located on a middle layer of the first flexible PCB cable, and the second flexible material part is located on a lower layer of the first flexible PCB cable, wherein the connection part comprises a first rigid material part, a second rigid material part and a hollow part between the first rigid material part and the second rigid material part, the first flexible material part comprises the first conducting wire, a first end part of the first conducting wire is connected to the first interface terminal, a second end part of the first conducting wire is connected to the third interface terminal, and the second flexible material part comprises the second conducting wire, a first end part of the second conducting wire is connected to the second interface terminal, a second end part of the second conducting wire is connected to the fourth interface terminal;

wherein the first rigid material part is located between a first end part of the first flexible material part and a first end part of the second flexible material part, and the second rigid material part is located between a second end part of the first flexible material part and a second end part of the second flexible material part; and wherein the first conducting wire passes through an upward third hole or a downward fifth hole to connect to the third interface terminal, and the second conducting wire passes through a downward fourth hole or a downward sixth hole to connect to the fourth interface terminal at the second end part of the second flexible material part.

14. The cable assembly according to claim 13, wherein the first conducting wire passes through an upward first hole to connect to the first interface terminal at the first end part of the first flexible material part, and the second conducting wire passes through a downward second hole to connect to the second interface terminal at the first end part of the second flexible material part.

15. The cable assembly according to claim 14, wherein the first joint is a golden finger connector, and the golden finger connector comprises a first golden finger, a second golden finger, a first pad, a second pad, a first external connection cable and a second external connection cable, wherein the first golden finger is located at the first end part of the first flexible material part and is perpendicular to the first hole, the first golden finger comprises the first interface terminal, the second end part of the first interface terminal passes through the first hole to connect to the first conducting wire, and the first end part of the first interface terminal is fastened by the first pad and is connected to the first signal port of the I/O connector through the first external connection cable; and the second golden finger is located at the first end part of the second flexible material part and is perpendicular to the second hole, the second golden finger comprises the second interface terminal, the second end part of the second interface terminal passes through the second hole to connect to the second conducting wire, and the first end part of the second interface terminal is fastened by the second pad and is connected to the second signal port of the I/O connector through the second external connection cable.

16. The cable assembly according to claim 13, wherein the second joint comprises a third golden finger and a fourth golden finger, the third golden finger is located at the second end part of the first flexible material part and is perpendicular to the third hole, the third golden finger comprises the third interface terminal, the first end part of the third interface terminal passes through the third hole to connect to the first conducting wire, and the second end part of the third interface terminal is inserted into a first golden finger slot on the main control board so as to connect to the first signal port on the main control board; and the fourth golden finger is located at the second end part of the second flexible material part and is perpendicular to the fourth hole, the fourth golden finger comprises the fourth interface terminal, the first end part of the fourth interface terminal passes through the fourth hole to connect to the second conducting wire, and the second end part of the fourth interface terminal is inserted into a second golden finger slot on the main control board so as to connect to the second signal port on the main control board.

17. The cable assembly according to claim 13, wherein the second joint is a socket elastic piece, the socket elastic piece comprises the third interface terminal and the fourth interface terminal, the first end part of the third interface terminal passes through a downward fifth hole to connect to the first conducting wire, and the second end part of the third interface terminal is inserted into the first signal port on the main control; and the first end part of the fourth interface terminal passes through a downward sixth hole to connect to the second conducting wire, and the second end part of the fourth interface terminal is inserted into the second signal port on the main control.

18. The cable assembly according to claim 13, wherein the cable assembly comprises a second flexible PCB cable, the first flexible PCB cable is connected to the second joint at a first end part of the first flexible PCB cable, and the second flexible PCB cable is connected to the second joint at a first end part of the second flexible PCB cable, wherein the cable assembly comprises:

an intermediate rigid support part, located between the first end part of the first flexible PCB cable and the first end part of the second flexible PCB cable; and an end rigid support part, located at the first end part of the first flexible PCB cable, wherein the intermediate rigid support part and the end rigid support part are located on opposite sides of the first flexible PCB cable, and the first flexible PCB cable is a flexible PCB cable connected only to one intermediate rigid support part.

19. The cable assembly according to claim 13, wherein the first conducting wire passes through a downward seventh hole to connect to the first interface terminal, and the second conducting wire passes through a downward eighth hole to connect to the second interface terminal at the first end part of the second flexible material part.

20. The cable assembly according to claim 19, wherein the first joint is a socket elastic piece, the socket elastic piece comprises the first interface terminal and the second interface terminal, the second end part of the first interface terminal passes through the seventh hole to connect to the first conducting wire, and the first end part of the first interface terminal is inserted into the first signal port of the I/O connector; and the second end part of the second interface terminal passes through the eighth hole to connect to the second conducting wire, and the first end part of the second interface terminal is inserted into the second signal port of the I/O connector.

* * * * *